United States Patent
Kim

(10) Patent No.: US 9,773,994 B2
(45) Date of Patent: Sep. 26, 2017

(54) ORGANIC LIGHT-EMITTING DIODE DISPLAY FOR SUPPRESSING ORGANIC LIGHT-EMITTING ELEMENT FROM BEING DAMAGED

(71) Applicant: LG DISPLAY CO., LTD., Seoul (KR)

(72) Inventor: Ji-Min Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/925,599

(22) Filed: Oct. 28, 2015

(65) Prior Publication Data

US 2016/0126498 A1    May 5, 2016

(30) Foreign Application Priority Data

Oct. 31, 2014   (KR) .................. 10-2014-0149932

(51) Int. Cl.
*H01L 27/32*  (2006.01)
*H01L 51/52*  (2006.01)

(52) U.S. Cl.
CPC ...... *H01L 51/5218* (2013.01); *H01L 51/5234* (2013.01); *H01L 51/5253* (2013.01); *H01L 2251/5315* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

| | | | |
|---|---|---|---|
| 2014/0021499 A1* | 1/2014 | Jang .................... | H01L 51/0097 257/98 |
| 2014/0070187 A1 | 3/2014 | Cho et al. | |
| 2014/0070195 A1 | 3/2014 | Choi et al. | |
| 2016/0093641 A1* | 3/2016 | Takahashi .......... | H01L 27/1225 257/43 |

FOREIGN PATENT DOCUMENTS

| | | |
|---|---|---|
| EP | 2581958 A2 | 4/2013 |
| EP | 2733763 A2 | 5/2014 |

\* cited by examiner

*Primary Examiner* — Hoai V Pham
(74) *Attorney, Agent, or Firm* — Dentons US LLP

(57) ABSTRACT

An organic light-emitting display (OLED) device includes: a lower substrate; an organic light-emitting element disposed on the lower substrate; an anti-oxidation layer covering the organic light-emitting element; an inorganic oxide encapsulation layer covering the anti-oxidation layer; a first organic layer covering the inorganic oxide encapsulation layer; and a first inorganic encapsulation layer covering the first organic layer. The anti-oxidation layer is configured to suppress the organic light-emitting element from being oxidized by oxygen ($O_2$) plasma at least in a pixel area.

15 Claims, 5 Drawing Sheets

ORGANIC LIGHT-EMITTING DIODE DISPLAY FOR SUPPRESSING ORGANIC LIGHT-EMITTING ELEMENT FROM BEING DAMAGED

CROSS-REFERENCE TO RELATED APPLICATIONS

This application claims priority of Korean Patent Application No. 10-2014-0149932 filed on Oct. 31, 2014, which is hereby incorporated by reference for all purposes as if fully set forth herein.

BACKGROUND OF THE INVENTION

Field of the Invention

The present invention relates to an organic light-emitting display (OLED) device. More specifically, the present invention relates to an OLED device including an anti-oxidation layer for suppressing an organic light-emitting element from being damaged by oxygen ($O_2$) plasma generated during a process of forming a transparent encapsulation layer to protect the organic light-emitting element.

Discussion of the Related Art

As the era of information technology has truly begun, the field of display devices has been rapidly growing, representing information in electrical signals in the form of visual images. In accordance with this, research is ongoing into various display devices, which need to be made thinner, lighter and more efficient in terms of power consumption. Display devices include a liquid crystal display (LCD) device, a plasma display panel (PDP) device, a field emission display (FED) device, an electro-wetting display (EWD) device, and an organic light emitting display (OLED) device, etc.

An OLED device is cable of producing light on its own (self-emissive). Thus, the OLED devices does not require an additional light source, unlike a liquid crystal display (LCD) device. Therefore, an OLED device can be made lighter and thinner than an LCD device. Further, an OLED device has advantages in that it is driven with low voltage to consume less power, and can present vivid colors, has fast response time, wide viewing angle and infinite contrast ratio (CR). For these reasons, an OLED device is currently considered as the next generation display device.

For a top-emission OLED device, a transparent electrode or a transflective (or a translucent or a semi-transparent) electrode is employed as a cathode in order to pass light generated (or emitted) in the organic light-emitting layer upwardly (i.e. towards the top) through the cathode. In addition, in order to ensure reliability of an OLED device, an encapsulation unit is formed on the organic light-emitting element including an organic light-emitting layer. Such layer is for protecting the organic light-emitting element from oxygen, moisture or physical impact or foreign matters (e.g., particles, debris or dust) possibly created during manufacturing process. In a top emission type OLED device, a glass encapsulation substrate or a thin-film encapsulation structure (encapsulation unit) in which an inorganic encapsulation layer and an organic layer are alternately stacked on one another for suppressing moisture permeation, etc. may be used as the encapsulation unit.

Such a thin-film encapsulation structure can reduce the thickness of flexible OLED devices, and thus much research is being conducted to improve thin-film encapsulation structures. Unfortunately, as an encapsulation unit is formed after an organic light-emitting element is formed, certain process constraints exist. For example, an encapsulation unit cannot be formed by a process carried out at a high temperature since the organic light-emitting layer would then be subject to undesirably high heat.

In addition, an inorganic encapsulation layer can effectively suppress oxygen and moisture permeation, but cracks or seams may occur in the inorganic encapsulation layer due to foreign matters or level differences (i.e. discontinuities caused by various step levels).

An organic layer planarizes the level difference (e.g., steps, tapers, or contact holes) made by a bank or a spacer and compensate foreign matters by covering cracks and seams at an inorganic encapsulation layer. However, despite such planarizing efforts, the organic layer cannot fully suppress oxygen and moisture permeation, and some amount of oxygen and moisture still permeate through the organic layer.

SUMMARY OF THE INVENTION

The inventor of the application has noted the fact that various kinds of foreign matter (debris) are created during a process of forming an organic light-emitting element on a substrate. Such foreign matter may occur due to different causes. For example, particles of organic materials used in forming an organic light-emitting element may adhere to one another to create foreign matter. Or, some metal particles are dislodged while depositing a cathode may adhere to one another to create foreign matter.

Such foreign matter typically have a size of 1 m or greater. In addition, such foreign matter may float around and ultimately rest on an organic light-emitting element, a bank or a spacer, causing defects thereto. For a top emission OLED device, a cathode has to be transparent and thus is formed very thin (e.g., the cathode is typically thinner than the size of debris particles). Accordingly, foreign matter may lead to cracks in the cathode. As a result, moisture may permeate through the cracks in the cathode to reach the organic light-emitting element.

The inventor of the application has looked into forming an encapsulation unit that protects an organic light-emitting element by a typical atomic layer deposition (ALD) method. For example, forming an encapsulation layer made of aluminum oxide (e.g., $Al_2O_3$), which is advantageous for thin, flexible display devices, has been considered. In such typical ALD method, oxygen ($O_2$) plasma used in forming the encapsulation layer oxidizes an organic light-emitting element via cracks or seams caused by foreign matter. Once an organic light-emitting element is oxidized, the organic light-emitting element is damaged and cannot emit light anymore.

In view of the above, the inventor has invented an organic light-emitting display device having a novel structure capable of eliminating an oxygen permeation path caused by cracks or seams even if cracks or seams occur in a cathode due to foreign matter.

In view of the above, an object of the present disclosure is to provide an OLED device that is capable of overcoming problems occurring when an encapsulation unit is formed by the ALD, wherein organic light-emitting element is oxidized by oxygen ($O_2$) plasma. Such issue is effectively resolved by employing an anti-oxidation layer capable of blocking oxygen and moisture permeation paths created by cracks or seams that may undesirably form at the cathode. Here, the anti-oxidation layer should not include any oxygen atoms.

It should be noted that objects of the present disclosure are not limited to the above-described object, and other objects of the present disclosure will be apparent to those skilled in the art from the following descriptions.

According to an aspect of the present disclosure, there is provided an organic light-emitting display (OLED) device including: a lower substrate; an organic light-emitting element on the lower substrate; an anti-oxidation layer configured to cover the organic light-emitting element; an inorganic oxide encapsulation layer configured to cover the anti-oxidation layer; a first organic layer configured to cover the inorganic oxide encapsulation layer; and a first inorganic encapsulation layer configured to cover the first organic layer. The anti-oxidation layer configured to suppress the organic light-emitting element from being oxidized by oxygen ($O_2$) at least in a pixel area.

The inorganic oxide encapsulation layer (e.g., an inorganic layer including oxygen atoms) and the first inorganic encapsulation layer are configured to be in contact with each other in a bezel area to seal the first organic layer The anti-oxidation layer may be made of silicon nitride or silicon oxynitride.

The organic light-emitting element may include a cathode, and the anti-oxidation layer may block an oxygen and moisture permeation path created by cracks of the cathode.

The OLED device may further include: a capping layer on the organic light-emitting element. The cathode may be disposed under the capping layer, and the anti-oxidation layer may block an oxygen and moisture permeation path created by cracks of the capping layer.

The anti-oxidation layer may have a thickness of 0.1 μm to 0.9 μm.

The inorganic oxide encapsulation layer may be formed by atomic layer deposition (ALD) using oxygen ($O_2$) plasma.

The inorganic oxide encapsulation layer may have a thickness of 200 Å to 1,500 Å

The inorganic oxide encapsulation layer may be made of aluminum oxide ($Al_2O_3$), zinc oxide (ZnO) or titanium oxide (TiO).

The first organic layer may be made of a polymer resin and formed by screen printing, slit coating, ink-jet printing, electric spray coating or chemical vapor deposition.

The OLED device may be a top-emission, type flexible display device.

The inorganic oxide encapsulation layer may cover the pixel area and the bezel area, and the first organic layer may be disposed to cover the pixel area and to be extended to cover a portion of the bezel area.

The OLED may further include: a second inorganic encapsulation layer configured to cover a second organic layer disposed on the first inorganic encapsulation layer and the second organic layer. The inorganic oxide encapsulation layer and the second inorganic encapsulation layer come in contact with each other in the bezel area to seal the first organic layer and the second organic layer.

According to the present disclosure, when an inorganic oxide encapsulation layer is formed by the ALD with oxygen $O_2$ plasma, it is possible to suppress an organic light-emitting element from being oxidized even if cracks occur in a cathode.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Figure 1:
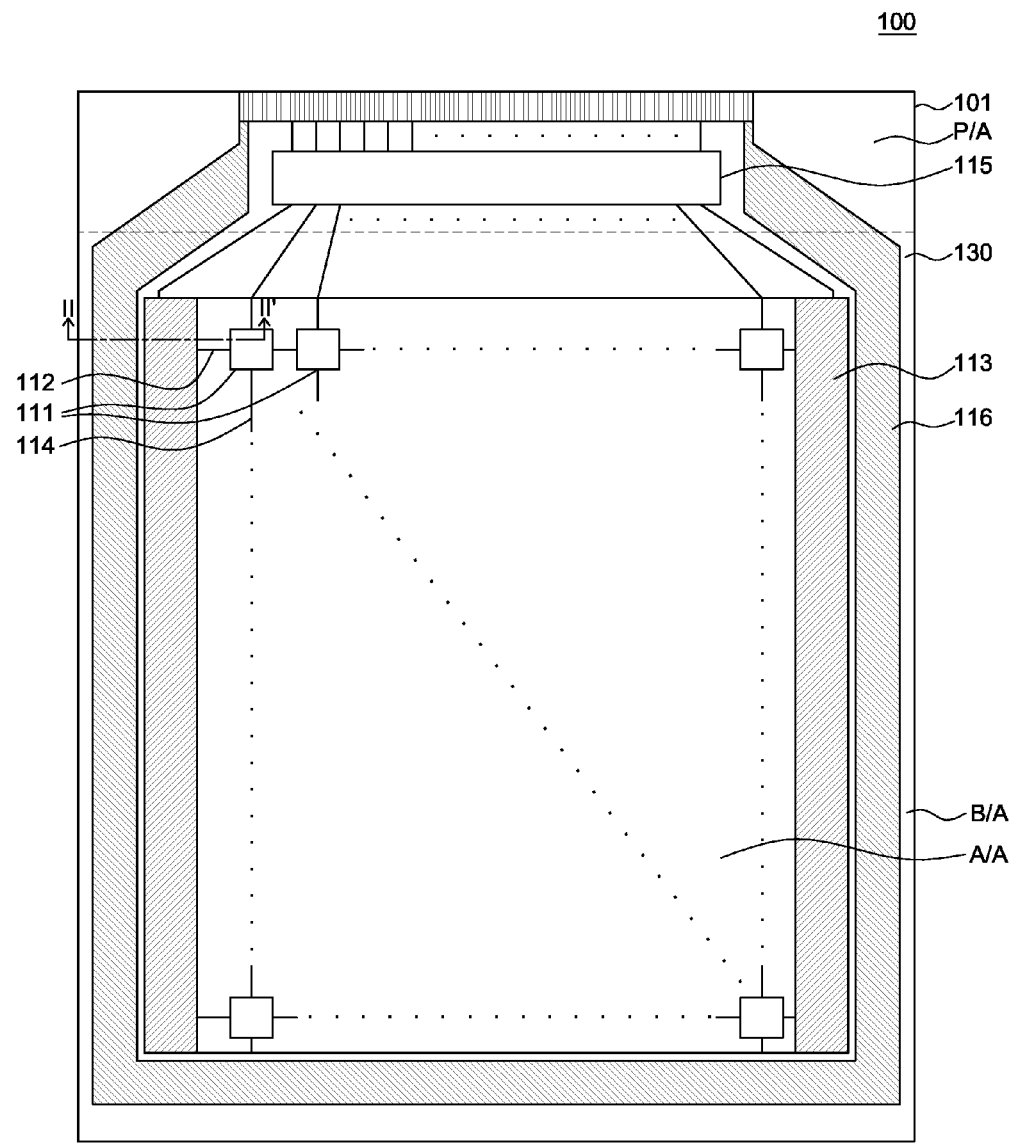
FIG. 1 is a schematic plan view of an organic light-emitting display (OLED) device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure can be defined by the claims.

The figures, dimensions, ratios, angles, numbers of elements given in the drawings are merely illustrative and are not limiting Like reference numerals denote like elements throughout the descriptions. Further, in describing the present disclosure, descriptions on certain technical matters may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B;" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, various technical interactions and linked operations are possible among some or all elements of the embodiments. Various exemplary embodiments can be practiced individually or in combination.

Hereinafter, exemplary embodiments of the present disclosure will be described in detail with reference to the accompanying drawings.

FIG. 1 is a schematic plan view of an OLED device according to an exemplary embodiment of the present disclosure.

Referring to FIG. 1, a pixel area A/A refers to the area where a plurality of pixels 111 are disposed. A pad area P/A refers to the area where a plurality of pads are disposed. A bezel area B/A refers to the area surrounding the pixel area A/A.

In the pixel area A/A of the OLED device 100, the plurality of pixels 111, a plurality of data lines 114 for delivering data signals generated in a data driver 115 to the plurality of pixels 111, and a plurality of gate lines 112 for delivering gate signals generated in a gate driver 113 to the plurality of pixels 111 are disposed.

In the bezel area B/A of the OLED device 100, the gate driver 113 for delivering gate signals to the plurality of gate lines 112 and a common voltage line 116 for supplying a common voltage Vss to a cathode of each of the plurality of pixels are disposed. Some of the elements disposed in the bezel area B/A may be extended to the pad area P/A.

In the pad area P/A of the OLED device 100, the data driver 115 for delivering image signals to the plurality of gate lines 112 and the plurality of data lines 114 connected to the data driver 115 are disposed. In the pad area P/A, a plurality of pads is disposed. Other locations and implementations are possible, depending upon circuitry layout and design.

An anisotropic conductive film (ACF) is applied in the pad area P/A. The elements such as the data driver 115, a flexible printed circuit (FPC), a cable or some other interconnection means are attached on the pads by the anisotropic conductive film.

A transparent encapsulation unit 130 covers the bezel area B/A and the pixel area A/A. The transparent encapsulation unit 130 does not cover the pads formed on the pad area P/A. Specifically, the transparent encapsulation unit 130 effectively suppresses the moisture permeation and also has good electrical insulating property. Accordingly, if the transparent encapsulation unit 130 covers the pad area P/A, a problem may arise that the plurality of pads formed on the pad area P/A is undesirably insulated.

The plurality of pixels 111 is disposed on the lower substrate 101. Each of the plurality of pixels 111 includes sub-pixels emitting light of red, green and blue (RGB) colors, respectively. At least one or each of the plurality of pixels 111 may further include a sub-pixel emitting light of white color. Each of the sub-pixels may further include a color filter or color refiner. Each of the plurality of pixels 111 is driven by respective thin-film transistors connected to the plurality of gate lines 112 and the plurality of data lines 114 crossing each other.

The data driver 115 generates a gate start pulse and a plurality of clock signals for driving the gate driver 113. The data driver 115 converts a digital signal received from an external source into an analog image signal by using gamma voltages generated in a gamma voltage generating unit. The converted image signal is delivered to the plurality of pixels 111 via the plurality of data lines 114. The data driver 115 may be attached on the plurality of pads disposed on the lower substrate 101.

The gate driver 113 includes a plurality of shift registers. Each of the shift registers is connected to the respective gate lines 112. The gate driver 113 receives the gate start pulse (GSP) and the plurality of clock signals from the data driver 115. As the shift registers in the gate driver 113 sequentially shift the gate start pulse, each of the plurality of pixels 111 connected to the respective gate lines 112 is activated.

The common voltage line 116 is disposed in the bezel area B/A to apply the common voltage Vss to the cathode. In the top emission OLED device 100, the cathode is configured as a thin film for better transmissivity. Accordingly, due to its thinness, the cathode has high electrical resistance. As a result, voltage drop may occur across the cathode and thus image quality may deteriorate. In order to help relieve this problem, the common voltage line 116 is disposed to surround the pixel area A/A. However, this is merely illustrative, and the common voltage line 116 may be formed on at least one side of the pixel area A/A. For the OLED device 100 having a relatively large-sized screen (such as for large screen TV products), auxiliary electrodes may be additionally disposed within the active area A/A.

Figure 2:
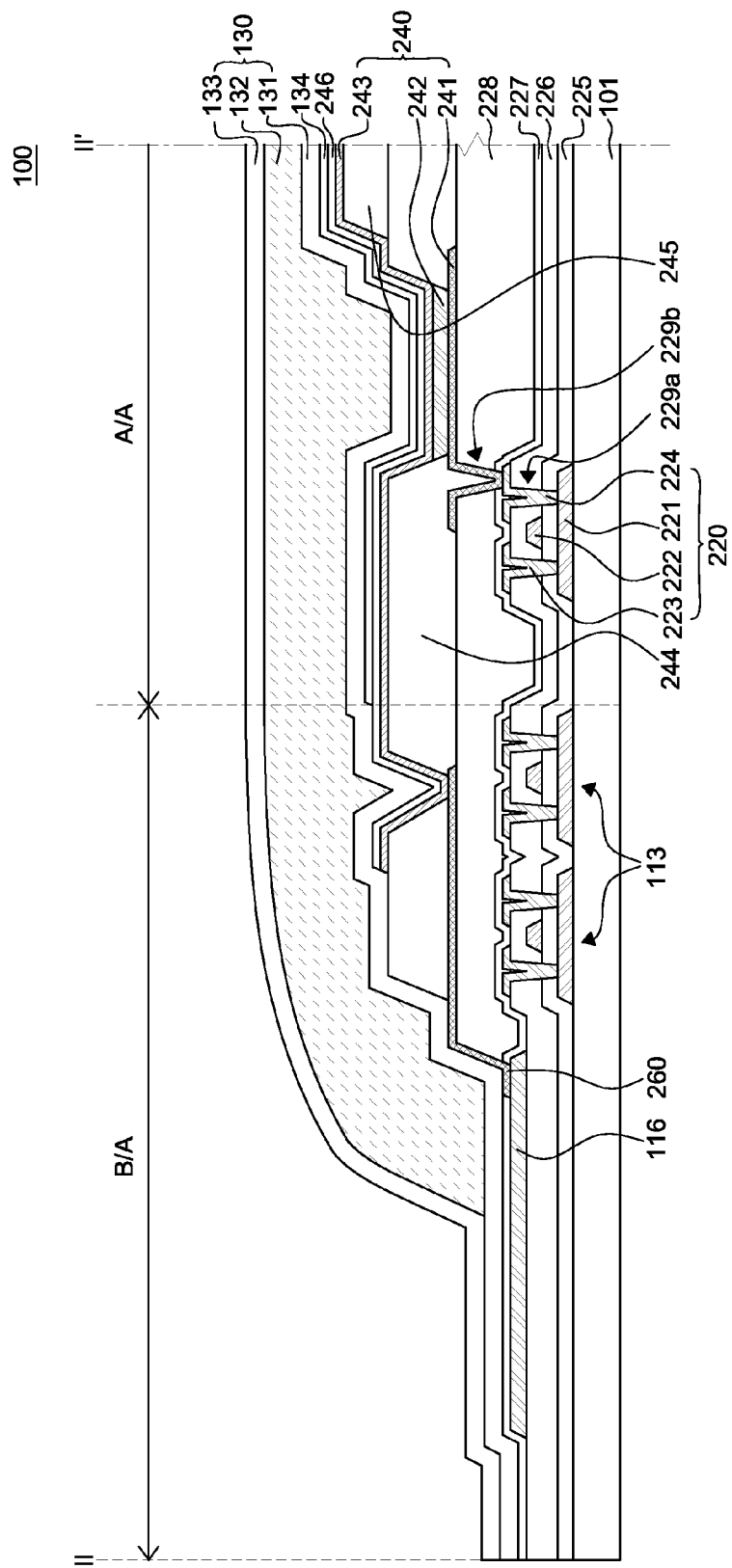
FIG. 2 is a cross-sectional view of the OLED device, taken along line II-II' of FIG. 1.

FIG. 2 is a cross-sectional view of the OLED device, taken along line II-II' of FIG. 1.

Referring to FIG. 2, the OLED device 100 according to the exemplary embodiment of the present disclosure includes a lower substrate 101, a thin-film transistor 220 disposed on the lower substrate 101, an organic light-emitting element 240 driven by the thin-film transistor 220, a gate driver 113 formed in the bezel area B/A, a common voltage line 116 formed in the bezel area B/A to apply the common voltage Vss to a cathode 243, a connection part 260 connecting the cathode 243 to the common voltage line 116, and a transparent encapsulation unit 130 protecting the pixel area A/A from moisture or oxygen.

The lower substrate 101 may be configured as a flexible film made of plastic, (e.g., a polyimide-based material), although other types of materials (such as glass, metal, etc.) that can achieve the desired characteristics for a flexible substrate can be used.

A back plate for supporting the OLED device 100 may be provided on the bottom surface of the lower substrate 101 so that the OLED device 100 is not too easily bent.

Further, multiple buffer layers respectively made of silicon nitride $SiN_x$ and silicon oxide SiOx may be laminated (stacked) and disposed between the lower substrate 101 and the thin-film transistor 220, thereby suppressing moisture and/or oxygen from permeating through the substrate 101.

The thin-film transistor 220 includes an active layer 221, a gate electrode 222, a source electrode 223 and a drain electrode 224. The active layer 221 (with its entirety or a portion thereof acting as a channel region) is covered by a gate insulating film 225. The gate electrode 222 is made of the same material as the gate line 112 and is disposed on the gate insulating film 225 over at least a portion of the active layer 221.

The gate electrode 222 is covered by an interlayer insulating film 226 (or other type of insulator) formed on the entire upper surface of the gate insulating film 225. The interlayer insulating film 226 may be formed in a multi-layered structure of silicon nitride and silicon oxide, but its configuration is not limited as such.

The source electrode 223 and the drain electrode 224 are made of the same material as the data line 114 and are formed on the interlayer insulating film 226 spaced apart from each other. The source electrode 223 is connected to one end of the active layer 221 via a first contact hole 229a passing through the gate insulating film 225 and the interlayer insulating film 226. The drain electrode 224 overlaps (or covers) at least the other end of the active layer 221 and is connected to the active layer 221 via another first contact hole 229a passing through the gate insulating film 225 and the interlayer insulating film 226. Although the coplanar thin-film transistor 220 is used in this example, an inverted staggered thin-film transistor may also be used.

A thin-film transistor insulating film 227 is formed on the thin-film transistor 220. However, the thin-film transistor insulating film 227 is optional and thus may not need to be formed on the thin-film transistor 220. The thin-film transistor insulating film 227 can also act to further block moisture permeating through the thin-film transistor 220.

A planarization layer 228 is disposed on the thin-film transistor insulating film 227. A second contact hole 229b passes through the planarization layer 228 and the thin-film transistor insulating film 227. The planarization layer 228 may be made of photo acrylic material having low dielectric permittivity. The thickness of the planarization layer 228 can be between 2 μm and 3.5 μm. The planarization layer 228 reduces parasitic capacitance occurring among the anode 241, the thin-film transistor 220, the gate lines 112 and the data lines 114 while providing a desired surface for the anode 241.

To amplify the luminous intensity, a lens-like layer (e.g., micro lens array) may be additionally formed or attached on the planarization layer 228 where the anode 241 is disposed.

The organic light-emitting element 240 includes an anode 241, a cathode 243 facing the anode 241, and an organic light-emitting layer 242 disposed therebetween. A light-emitting area of the organic light-emitting layer 242 may be defined by a bank 244.

The organic light-emitting element 240 may be configured to emit light of one of red, green and blue (RGB) colors or may be configured to emit light of white color. For the organic light-emitting element 240 emitting light of white color, a color filter or color refiner may be additionally disposed.

The anode 241 is disposed on the planarization layer 227 in the light-emitting area of each of the pixels 111, and is connected to the drain electrode 224 of the thin-film transistor 220 via the second contact hole 229b passing through the planarization layer 228. The anode 241 is made of a metallic material having a high work function. In order to exhibit reflective property, the anode 241 may be made of a reflective material or may include a reflective plate on its bottom surface. The voltage at anode 241 corresponds to image signal for displaying an image via the drain electrode 224.

The bank 244 is disposed on the planarization layer 228 between non-emitting areas of the pixels 111 and can have a tapered shape. The bank 244 overlaps (or covers) at least a portion of the edge of the anode 241. The height of the bank 244 is for example, between 1 μm and 2 μm.

A spacer 245 may be formed on the bank 244. The spacer 245 may be made of the same material as the bank 244. For example, the bank 244 and the spacer 245 may be made of polyimide. The space 245 may protect the organic light-emitting element 240 from being damaged by a fine metal mask (FMM) that comes in contact thereon and used in patterning the organic light-emitting layer 242. The height of the spacer 245 is for example, between 1.5 μm and 2.5 μm. This configuration allows damage on the organic light-emitting element 240 during a process using a FMM to be reduced. However, the spacer 245 is optional and thus may not be formed on the bank 244. Such spacers may act to maintain a desired gap or distance between the substrates.

As the bank 244 and the spacer 245 are made of organic materials, oxygen and moisture can easily permeate through them. Accordingly, if a crack (or other irregularity) occurs in the cathode 243 formed on the bank 244 and the spacer 245, portions of the organic light-emitting element 240 near the crack may be oxidized by oxygen permeating through the bank 244 and the spacer 245. However, the spacer 245 can be optional and thus may be eliminated depending on types of the organic light-emitting layer 242 of the organic light-emitting element 240.

The organic light-emitting layer 242 is formed on the anode 241. The cathode 243 is disposed facing the anode 241 with the organic light-emitting layer 242 therebetween. The organic light-emitting layer 242 may be made of a phosphorescent material, a fluorescent material, combinations thereof, or some other light emission material, and includes an electron transporting layer (ETL), a hole transporting layer (HTL), and a charge generating layer (CGL). Additional layers related to electron, hole, and charge characteristics may be implemented. Also, various functions may be combined into or integrated as a single layer.

The cathode electrode 243 is made of a very thin, metallic material having a low work function or a transparent conductive oxide (TCO). For the cathode 243 made of a metallic material, its thickness may be 1,500 Å or less, or 400 Å or less. With a thickness within the above range, the cathode 243 is a substantially transflective layer, and thus a substantially transparent layer. The common voltage Vss is applied to the cathode 243.

A capping layer 246 (or some other equivalent functional layer) is disposed on the cathode 243. The capping layer 246 is employed to improve optical properties of the organic light-emitting element 240. The capping layer 246 may be made of a material having a high refractive index. For example, with the capping layer 246 having a refractive index from 1.7 to 2.5, the luminous efficiency and the viewing angle of the organic light-emitting element 240 can be improved. The thickness of the capping layer 246 may be between 100 Å and 1,000 Å. The capping layer 246 may be made of a transition metal such as Ag, Au, Fe, Ni, Cu, Zn and Cr. Although the capping layer 246 is included in the OLED device 100 in FIG. 2, the capping layer 246 may be eliminated therefrom depending upon the characteristics of the particular OLED device or display application.

The gate driver 113 includes a plurality of thin-film transistors. The plurality of thin-film transistors of the gate driver 113 is formed together with the thin-film transistors 220 in the pixel area A/A during the same process. Therefore, the thin-film transistors of the gate driver 113 will not be described to avoid redundancy.

The common voltage line 116 may be made of the same metal as the gate lines 112 and/or the data lines 114 as a single layer or multiple layers.

The common voltage line 116 applies the common voltage Vss to the cathode 243. The thin-film transistor insulating layer 227 may be disposed on the common voltage line 116. The common voltage line 116 is disposed more to the outside than the gate driver 113.

The connection part 260 may be disposed on the planarization layer 228 above the gate driver 113. The connection part 260 connects the common voltage line 116 to the cathode 243. The connection part 260 may be made of the same material as the anode 241.

The connection part 260 is connected to the common voltage line 116 along a sloped surface of one end of the planarization layer 228. If there is an insulating layer between the connection part 260 and the common voltage line 116, the connection part 260 is connected to the common voltage line 116 via a contact hole.

The cathode 243 is disposed on the bank 244 and/or the spacer 245 to be extended to a part of the bezel area B/A. The cathode 243 is connected to the connection part 260 in the bezel area B/A where no bank is formed.

The operation of the above-described structure will be described briefly. The gate electrode 222 of the thin-film transistor 220 receives driving signals generated in the gate electrode 113 via the gate line 112. Further, the conductivity of the active layer 221 is varied in response to a signal applied to the gate electrode 222. Then, an image signal applied to the source electrode 223 via the active layer 221 is applied to the anode 241. Then, the common voltage Vss is applied to the cathode 243 and the organic light-emitting layer 242 emits light, thereby displaying images.

Thus far, the structure with respect to the cross section of the thin-film transistor 220 and the organic light-emitting element 240 disposed in the bezel area B/A and the pixel area A/A has been described.

Hereinafter, the transparent encapsulation unit 130 of the OLED device 100 according to an exemplary embodiment of the present disclosure will be described. The transparent encapsulation unit 130 includes an anti-oxidation layer 134, an inorganic oxide encapsulation layer 131, a first organic layer 132 and a first inorganic encapsulation layer 133.

The anti-oxidation layer 134 is formed on the capping layer 246 in the pixel area A/A. Specifically, the anti-oxidation layer 134 covers (or overlaps) the capping layer 246 at least in the pixel area A/A.

If no capping layer is formed on the cathode 243, the anti-oxidation layer 134 is directly disposed on and covers (overlaps) the cathode 243.

The anti-oxidation layer 134 blocks oxygen and moisture permeation paths created by cracks in the cathode 243, and thereby suppresses the organic light-emitting element 240 from being oxidized. The anti-oxidation layer 134 is formed using an inert gas such as nitrogen ($N_2$), argon (Ar) and helium (He) in order not to oxidize the organic light-emitting element 240. By doing so, the organic light-emitting element 240 is not oxidized during the process of forming the anti-oxidation layer 134.

In forming the anti-oxidation layer 134, silicon nitride ($SiN_x$) or silicon oxynitride (SiON) are used. The anti-oxidation layer 134 suppresses the organic light-emitting element 240 from being oxidized when cracks occur in the cathode 243. Accordingly, the anti-oxidation layer 134 can be configured as thin as possible, as long as oxidation by oxygen $O_2$ plasma (or due to other sources) can be suppressed. For example, the anti-oxidation layer 134 may have a thickness of 1 μm or less. For example, the anti-oxidation layer 134 may have a thickness between 0.1 μm and 0.9 μm. In particular, if the anti-oxidation layer 134 has a thickness of 0.9 μm or greater, the anti-oxidation layer 134 is less flexible and cracks are more easily occurred therein. Accordingly, for implementing a flexible display device, it is desirable to make the thickness of the anti-oxidation layer 134 as small as possible as long as the organic light-emitting element 240 can be effectively suppressed from being oxidized. The particular thickness can be set in view of the trade-off in performance depending upon the desired characteristics of the OLED device in the final product. For example, a smartphone or table having a foldable form-factor may require better flexibility, while a minimum level of anti-oxidation would be sufficient. Alternatively, an OLED product in an environment more prone to oxygen permeation (e.g. outdoor advertisement display, vehicle display screens, etc.) may be configured with a relatively thicker anti-oxidation layer, although some amount of flexibility would be lost. The anti-oxidation layer 134 may be formed by the chemical vapor deposition (CVD). In particular, as the CVD is performed in a short period of deposition time, it is possible to reduce manufacturing time of the OLED device 100.

By forming the inorganic oxide encapsulation layer 131 after the anti-oxidation layer 134 is formed, it is possible to suppress the organic light-emitting element 240 from being oxidized by oxygen ($O_2$) plasma or other sources used during the process of depositing the inorganic oxide encapsulation layer 131.

The inorganic oxide encapsulation layer 131 is made of aluminum oxide ($Al_2O_3$), zinc oxide (ZnO) or titanium oxide (TiO). The inorganic oxide encapsulation layer 131 may be formed by the atomic layer deposition (ALD).

The thickness of the inorganic oxide encapsulation layer 131 may be between 200 Å to 1,500 Å. In particular, the inorganic oxide encapsulation layer 131 formed by the ALD can effectively suppress moisture permeation even if it is relatively thin. In addition, as the inorganic oxide encapsulation layer 131 can be made relatively thin, it is advantageous for implementation in thin and flexible display devices. Moreover, as the inorganic oxide encapsulation layer 131 can achieve high visible light transmissivity, it is appropriate for top emission OLED devices.

The first organic layer 132 is disposed on the inorganic oxide encapsulation layer 131. The first organic layer 132 may be made of a polymer resin. For example, acrylic or epoxy resin may be used. Such polymer resin is flowable (due to certain surface tension and fluid characteristics) and can planarize (or flatten) the level (or layer height) difference caused by the bank 244 or the spacer 245. The first organic layer 132 may be formed by screen printing, slit coating, ink-jet printing, or electric spray coating.

The first organic layer 132 may have a thickness between 3 μm and 20 μm. For example, the first organic layer 132 may have a thickness between 5 μm and 10 μm. If the thickness of the first organic layer 132 is 3 μm or less, some portion may not be properly applied during screen printing process, and thus undesirable pin holes appear. If the thickness of the first organic layer 132 is 10 μm or greater, the flexible display device has reduced flexibility, thereby causing cracks to occur more easily when the device is bent or flexed.

The first organic layer 132 may be made of silicon oxycarbon (SiOC). Silicon oxycarbon has a carbon content of 1% to 50%. With a higher carbon content, the silicon oxycarbon becomes more flowable, so that it can easily cover (or compensate for) foreign matter or debris particles and thus exhibits better planarization. If the first organic layer 132 is made of silicon oxycarbon, it has a thickness of 1.5 μm to 3 μm.

The first inorganic encapsulation layer 133 may be made of aluminum oxide ($Al_2O_3$), silicon nitride ($SiN_x$), silicon oxide (SiOy), etc. or various combinations thereof. The first inorganic encapsulation layer 133 may be formed by the ALD or the CVD.

If the first inorganic encapsulation layer 133 is formed by the ALD, the first inorganic encapsulation layer 133 may have a thickness of 200 Å to 1,500 Å.

If the first inorganic encapsulation layer 133 is formed by the CVD, the first inorganic encapsulation layer 133 may have a thickness of 5,000 Å to 15,000 Å. In particular, since the CVD method requires a shorter period of deposition time than the ALD method, it is advantageous for forming relatively thick films and mass production can be more easily achieved.

The inorganic oxide encapsulation layer 131 and the first inorganic encapsulation layer 133 come in contact with each other in the bezel area B/A, to seal the first organic layer 132. Accordingly, the first organic layer 132 is not directly exposed to air, and thus no oxygen or moisture permeation path is created.

Figure 3:
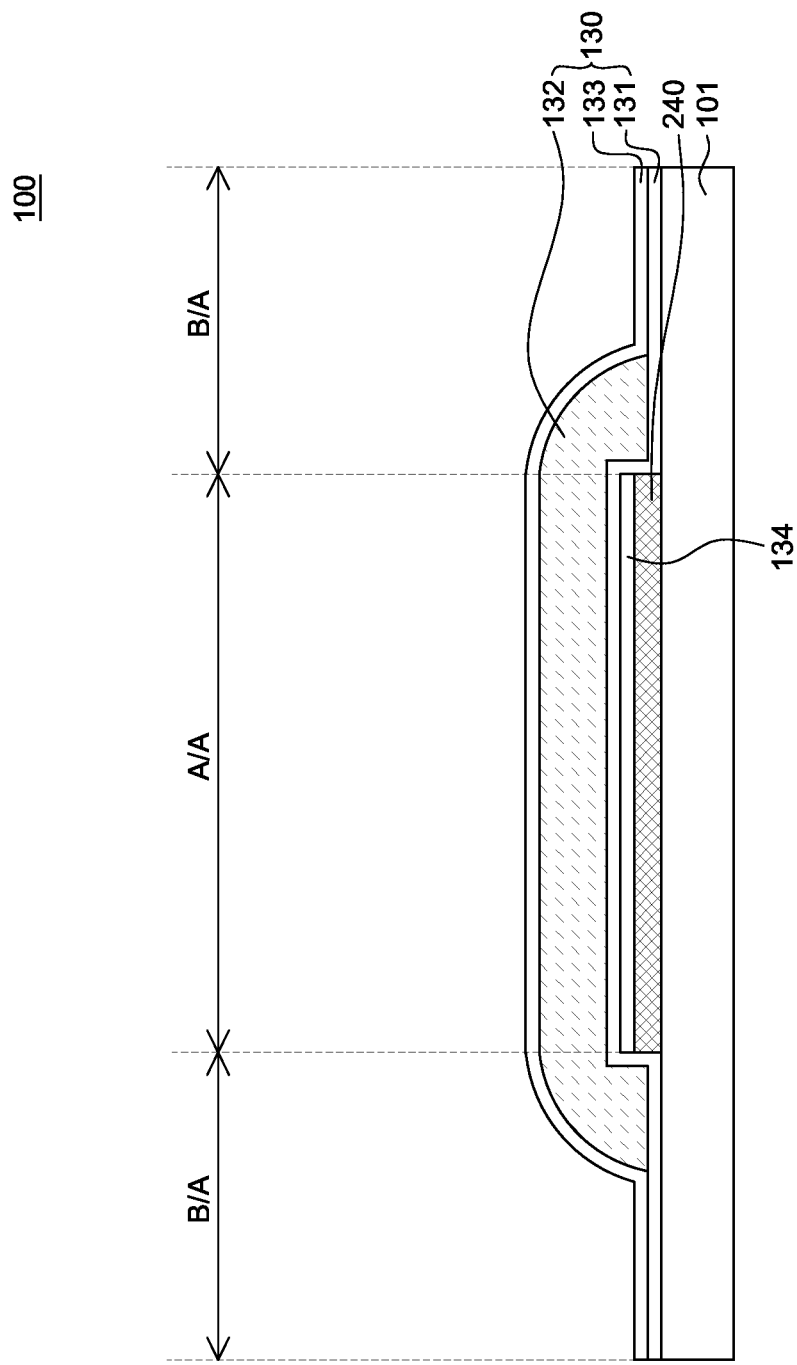
FIG. 3 is a schematic cross-sectional view for illustrating a transparent encapsulation unit of an OLED device according to an exemplary embodiment of the present disclosure.

FIG. 3 is a schematic cross-sectional view illustrating a transparent encapsulation unit of an OLED device according to an exemplary embodiment of the present disclosure.

For convenience of illustration, FIG. 3 only shows the lower substrate 101, the organic light-emitting element 240 and the transparent encapsulation unit 130 of the OLED device 100 according to the embodiment shown in FIGS. 1 and 2, and other elements are not illustrated merely for avoiding redundancy.

The transparent encapsulation unit 130 (or some other type of barrier against moisture, oxygen, impurities, etc.) according to the exemplary embodiment of the present disclosure includes the anti-oxidation layer 134, the inorganic oxide encapsulation layer 131, the first organic layer 132 and the first inorganic encapsulation layer 133.

The anti-oxidation layer 134 covers at least the pixel area A/A. Although the anti-oxidation layer is formed only in the pixel area A/A in FIG. 3, the anti-oxidation layer 134 may have the same area as the inorganic oxide encapsulation layer 133, i.e., it may be formed on the entire upper surface of the substrate 101.

The inorganic oxide encapsulation layer 131 covers the pixel area A/A and the bezel area B/A. This is, however, merely illustrative. The inorganic oxide encapsulation layer 131 may not be formed at some portions of the bezel area B/A.

The first organic layer 132 covers the pixel area A/A and is extended to cover a part of the bezel area B/A.

The first inorganic encapsulation layer 133 covers the first organic layer 132 and comes in contact with the inorganic oxide encapsulation layer 131 in the bezel area B/A to seal the first organic layer 132. Accordingly, the first organic layer 132 is not directly exposed to air, and thus no direct oxygen and moisture permeation path is created.

Figure 4:
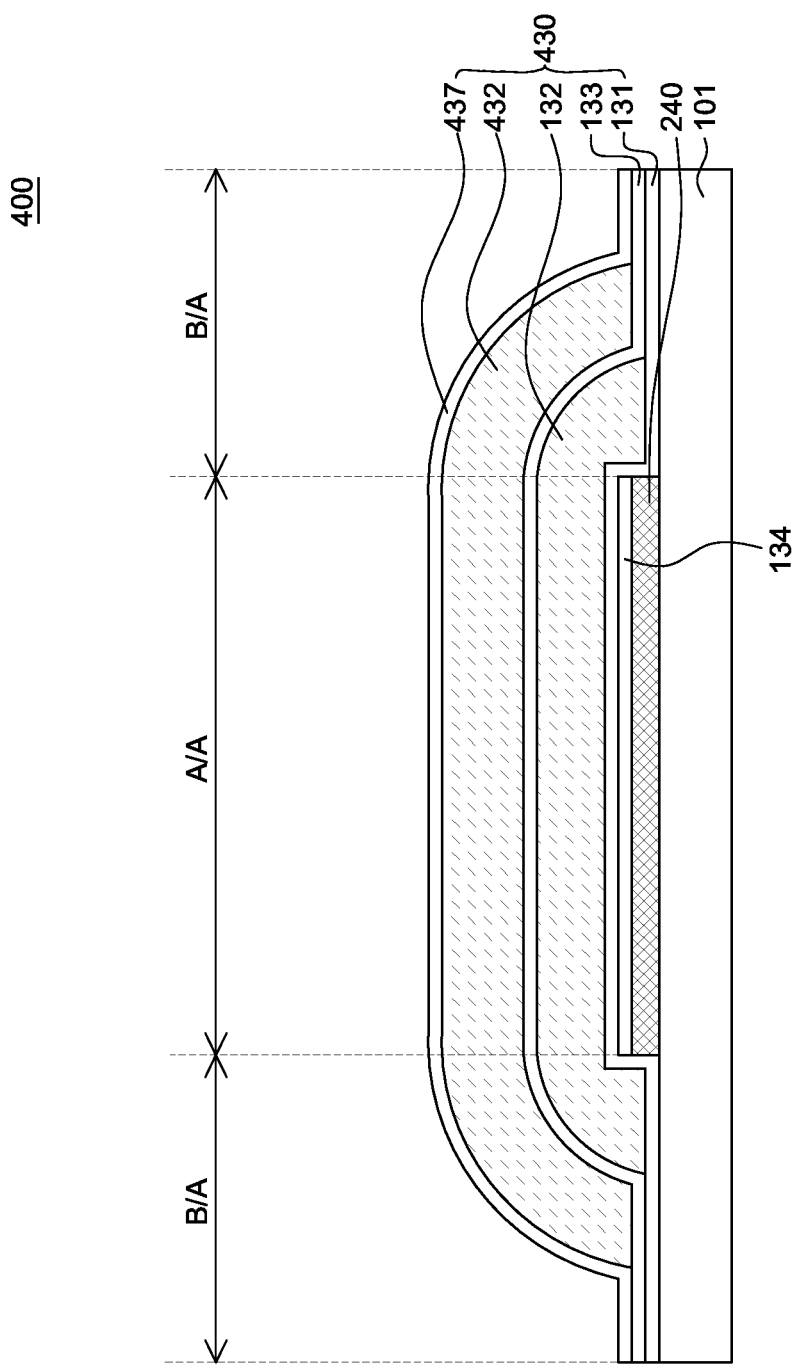
FIG. 4 is a schematic cross-sectional view for illustrating a transparent encapsulation unit of an OLED device according to another exemplary embodiment of the present disclosure.

FIG. 4 is a schematic cross-sectional view for illustrating a transparent encapsulation unit of an OLED device according to another exemplary embodiment of the present disclosure.

A transparent encapsulation unit 430 of an OLED device 400 according to this exemplary embodiment of the present disclosure is a modification of the transparent encapsulation unit 130 of the OLED device 100 according to the exemplary embodiment of the present disclosure in FIGS. 2 and 3.

The transparent encapsulation unit 430 of the OLED device 400 according to this exemplary embodiment of the present disclosure further includes a second organic layer 432 and a second inorganic encapsulation layer 437.

The second organic layer 432 is disposed on the first inorganic encapsulation layer 133 to cover the pixel area A/A and to be extended to cover a part of the bezel area B/A.

Although the second organic layer 432 has the same area as the first organic layer 132 in FIG. 4, the second organic layer 432 may have a different or larger area than that of the first organic layer 132. If the second organic layer 432 is further extended toward the bezel area B/A from the end of the first organic layer 132, the end of the second organic layer 432 becomes smoother, reducing cracks in the second inorganic encapsulation layer 437.

The second inorganic encapsulation layer 437 covers the second organic layer 432 and comes in contact with the first inorganic encapsulation layer 133 to seal the second organic layer 432. Accordingly, the second organic layer 432 is not directly exposed to air, and thus no oxygen and moisture permeation path is created.

The second inorganic encapsulation layer 437 may be made of one of the materials usable for the first inorganic encapsulation layer 133. The second inorganic encapsulation layer 437 may be formed by one of the techniques for forming the first inorganic encapsulation layer 133.

The elements of the OLED device 400 excluding those described above are identical to those of the OLED device 100; and, therefore, will not be described to avoid redundancy.

This configuration allows the transparent encapsulation unit 430 to more effectively suppress moisture permeation by the second inorganic encapsulation layer 437 and the second organic layer 432.

Figure 5:
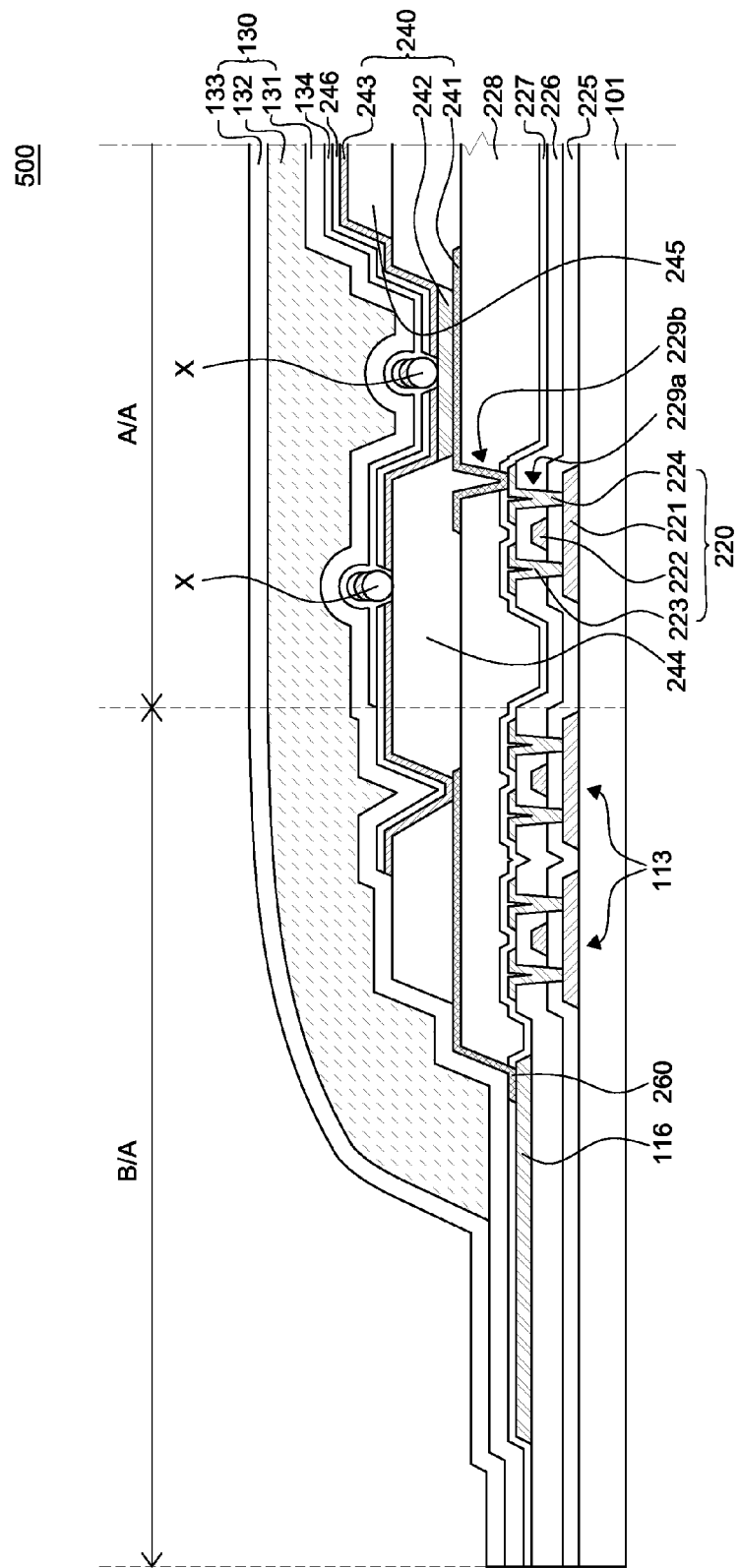
FIG. 5 is a schematic cross-sectional view for illustrating a scenario where foreign matters are created in an OLED device according to an exemplary embodiment of the present disclosure.

FIG. 5 is a schematic cross-sectional view illustrating a scenario where foreign matter (debris) particles are created in an organic light-emitting element of an OLED device according to an exemplary embodiment of the present disclosure.

Referring to FIG. 5, foreign matter X is created on the organic light-emitting element 240 and the bank 244. Cracks may occur in the cathode 243 and the capping layer 246 by the foreign matter X. Even so, oxygen permeation paths are effectively blocked by the anti-oxidation layer 134. That is, spaces made by the cracks in the cathode 243 and the capping layer 246 are sufficiently filled with the anti-oxidation layer 134, so that the organic light-emitting element 240 is not oxidized during the process of forming the inorganic oxide encapsulation layer 131.

The elements of the OLED device 500 excluding those described above are identical to those described above with respect to the OLED device 100; and, therefore, will not be described to avoid redundancy.

According to some embodiments of the present disclosure, a touch panel (or other types of touch screen related structures) may be disposed on the transparent encapsulation unit. According to some embodiments of the present disclosure, a barrier film may be disposed on the transparent encapsulation unit. According to some embodiments of the present disclosure, a color filter or color refiner may be disposed on the transparent encapsulation unit.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. An organic light-emitting display (OLED) device, comprising:
    a lower substrate including a pixel area and a bezel area adjacent to or surrounding the pixel area;
    an organic light-emitting element in the pixel area on the lower substrate;
    an anti-oxidation layer configured to cover the organic light-emitting element;
    an inorganic oxide encapsulation layer configured to cover the anti-oxidation layer;
    a first organic layer configured to cover the inorganic oxide encapsulation layer; and
    a first inorganic encapsulation layer configured to cover the first organic layer,
    wherein the anti-oxidation layer is configured to suppress the organic light-emitting element from being oxidized by the oxygen (O2) plasma at least in the pixel area,
    wherein the anti-oxidation layer is disposed only in the pixel area corresponding to the organic light-emitting element and not disposed in the bezel area.

2. The OLED display of claim 1, wherein the inorganic oxide encapsulation layer and the first inorganic encapsulation layer are configured to be in contact with each other in a bezel area to seal the first organic layer.

3. The OLED display of claim 2, wherein the anti-oxidation layer is made of silicon nitride or silicon oxynitride.

4. The OLED display of claim 3, wherein the organic light-emitting element comprises a cathode, and
    wherein the anti-oxidation layer is configured to block an oxygen and moisture permeation path created by cracks of the cathode.

5. The OLED display of claim 4, further comprising a capping layer on the organic light-emitting element,
    wherein the cathode is disposed under the capping layer, and
    wherein the anti-oxidation layer is configured to block an oxygen and moisture permeation path created by cracks of the capping layer.

6. The OLED display of claim 4, wherein the anti-oxidation layer has a thickness of 0.1 μm to 0.9 μm.

7. The OLED display of claim 6, wherein the inorganic oxide encapsulation layer is made of aluminum oxide (Al2O3), zinc oxide (ZnO) or titanium oxide (TiO).

8. The OLED display of claim 4, wherein the OLED device is a top-emission, flexible display device.

9. The OLED display of claim 1, wherein the inorganic oxide encapsulation layer has a thickness of 200Å to 1,500Å.

10. The OLED display of claim 1, wherein the first organic layer is made of a polymer resin and is formed by screen printing, slit coating, ink-jet printing, electric spray coating or chemical vapor deposition.

11. The OLED display of claim 1, wherein the inorganic oxide encapsulation layer covers the pixel area and the bezel area, and
    wherein the first organic layer is disposed to cover the pixel area and to be extended to cover a part of the bezel area.

12. The OLED display of claim 1, further comprising:
    a second organic layer disposed on the first inorganic encapsulation layer; and
    a second inorganic encapsulation layer configured to cover the second organic layer,
    wherein the first inorganic encapsulation layer and the second inorganic encapsulation layer are configured to come in contact with each other in the bezel area to seal the first organic layer and the second organic layer.

13. The OLED display of claim 1, wherein a transparent encapsulation unit comprises the anti-oxidation layer, the inorganic oxide encapsulation layer, the first organic layer and the first inorganic encapsulation layer.

14. The OLED display of claim 13, wherein a touch panel is disposed on the transparent encapsulation unit.

15. The OLED display of claim 13, wherein a color filter is disposed on the transparent encapsulation unit.

* * * * *